(12) United States Patent
Oza et al.

(10) Patent No.: US 9,632,499 B2
(45) Date of Patent: Apr. 25, 2017

(54) WORK-IN-PROGRESS SUBSTRATE PROCESSING METHODS AND SYSTEMS FOR USE IN THE FABRICATION OF INTEGRATED CIRCUITS

(71) Applicant: GLOBALFOUNDRIES, Inc., Grand Cayman (KY)

(72) Inventors: Chinmay Oza, Mechanicville, NY (US); Gero Grau, Dresden (DE); William Fosnight, Saratoga Springs, NY (US); Detlef Pabst, Saratoga Springs, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/530,947

(22) Filed: Nov. 3, 2014

(65) Prior Publication Data

US 2016/0126120 A1    May 5, 2016

(51) Int. Cl.
*H01L 21/31* (2006.01)
*G05B 19/418* (2006.01)
(Continued)

(52) U.S. Cl.
CPC .... *G05B 19/4189* (2013.01); *H01L 21/67276* (2013.01); *H01L 21/67727* (2013.01);
(Continued)

(58) Field of Classification Search
CPC ......... H01L 21/67727; H01L 21/67769; H01L 21/67733; H01L 21/67736; H01L 21/67763; H01L 21/67766; H01L 21/67778; H01L 21/67781; G05B 19/41865
(Continued)

(56) References Cited

U.S. PATENT DOCUMENTS 5,980,183 A    11/1999  Fosnight
6,456,894 B1 *  9/2002  Nulman ............. G03F 7/70525
                                                        438/5
(Continued)

*Primary Examiner* — Brook Kebede
(74) *Attorney, Agent, or Firm* — Lorenz & Kopf, LLP

(57) ABSTRACT

Disclosed herein are methods and systems for semiconductor fabrication. In one embodiment, a method for fabricating semiconductors utilizing a semiconductor fabrication system includes performing a semiconductor fabrication process on a first lot of unprocessed semiconductor substrates with a semiconductor fabrication equipment unit to form a first lot of processed substrates and communicating processing data regarding the first lot of processed substrates from the semiconductor fabrication equipment unit to a just-in-time (JIT) module of the semiconductor fabrication system. The method further includes determining a processing priority of the first lot of processed substrates and a processing priority of a second lot of unprocessed substrates at the JIT module and scheduling removal of the first lot of processed substrates from the semiconductor fabrication equipment unit and delivery of the second lot of unprocessed substrates to the semiconductor fabrication equipment unit by the JIT module based on the processing data and the priority of one or both of the first lot of processed substrates and the second lot of unprocessed substrates.

10 Claims, 4 Drawing Sheets

(51) Int. Cl.
 H01L 21/67 (2006.01)
 H01L 21/677 (2006.01)
(52) U.S. Cl.
 CPC ........ *H01L 21/67733* (2013.01); *G05B 2219/31002* (2013.01); *G05B 2219/31013* (2013.01); *G05B 2219/45031* (2013.01)
(58) Field of Classification Search
 USPC .............................................. 438/758, 763
 See application file for complete search history.

(56) References Cited

U.S. PATENT DOCUMENTS

2006/0155412 A1* 7/2006 Ikeda ............... G05B 19/41865
  700/112
2014/0277668 A1 9/2014 Oza et al.

* cited by examiner

WORK-IN-PROGRESS SUBSTRATE PROCESSING METHODS AND SYSTEMS FOR USE IN THE FABRICATION OF INTEGRATED CIRCUITS

TECHNICAL FIELD

The present disclosure generally relates to methods and systems for fabricating integrated circuits. More particularly, the present disclosure relates to work-in-progress (WIP) substrate processing methods and systems for use in the fabrication of integrated circuits.

BACKGROUND

In the global marketplace, manufacturers seek to produce high-quality products at low prices. It is thus important to improve yield and process efficiency to minimize production costs. This holds especially true in the technological field of semiconductor fabrication, where manufacturers employ cutting-edge technologies with volume production techniques. One goal of semiconductor manufacturers is to reduce the consumption of raw materials and other consumables while at the same time improving process tool utilization. The latter aspect is of particular importance because, in modern semiconductor facilities, the purchase and operation of the required processing equipment are cost intensive and represent a dominant portion of the total semiconductor production cost.

Integrated circuits and other semiconductor devices are typically manufactured in automated or semi-automated facilities. The manufacturing process is performed, in part, by passing semiconductor substrates through a large number of process steps to complete the fabrication of the integrated circuits thereon. During the fabrication process, semiconductor substrates are referred to as "work-in-progress" or "WIP" substrates. The number and the type of process steps to which a semiconductor substrate is subjected depend on the specifics of the semiconductor device to be fabricated. For instance, a sophisticated central processing unit (CPU) may require several hundred process steps, each of which must be carried out within specified process margins to achieve the required device specifications.

In a semiconductor facility, a plurality of different product types are usually manufactured at the same time, such as memory chips of different design and storage capacity, CPUs of different design and operating speed, and the like. The number of different product types may even reach a hundred or more in some production lines. Each of the different product types may require a specific process flow, and require different mask sets for lithography and specific settings in various process tools, such as deposition tools, etch tools, implantation tools, and chemical mechanical polishing (CMP) tools. Consequently, a plurality of different tool parameter settings and product types may be encountered simultaneously in a manufacturing environment. Further, a mixture of product types, such as test and development products, pilot products, and different versions of products, at different manufacturing stages may be present in the manufacturing environment at any given time. The composition of this mixture may vary over time depending on economic constraints. Still further, it is common that the various product types may have to be processed with a different priority to meet requirements imposed by specific economic, customer, or other constraints.

In order to maximize production efficiency and minimize production costs, it is desirable to coordinate the process flow within the manufacturing environment in such a way that a high degree of tool utilization is achieved. That is, it is desirable for each of the numerous fabrication tools in the fabrication facility to be in use as often as possible, with as little "down-time" as possible. Tool utilization is an important cost factor due to the high investment costs of such tools and the moderately-low life span of semiconductor process tools. Tool utilization is thus a significant component in the determination of the price of fabricated semiconductor devices.

Accordingly, it is desirable to provide semiconductor fabrication methods and systems that reduce process tool idle time and increase tool utilization by reducing time intervals between the completion of a processing step on a lot of WIP substrates and the commencement of a processing step on a successive lot of WIP substrates. Furthermore, other desirable features and characteristics of the semiconductor fabrication methods and systems will become apparent from the subsequent detailed description and the appended claims, taken in conjunction with the accompanying drawings, brief summary, and this background.

BRIEF SUMMARY

Disclosed herein are work-in-progress (WIP) substrate processing methods and systems for use in the fabrication of integrated circuits. In one exemplary embodiment, a method for fabricating semiconductors utilizing a semiconductor fabrication system includes performing a semiconductor fabrication process on a first lot of unprocessed semiconductor substrates with a semiconductor fabrication equipment unit to form a first lot of processed substrates and communicating processing data regarding the first lot of processed substrates from the semiconductor fabrication equipment unit to a just-in-time (JIT) module of the semiconductor fabrication system. The method further includes determining a processing priority of the first lot of processed substrates and a processing priority of a second lot of unprocessed substrates at the JIT module and scheduling removal of the first lot of processed substrates from the semiconductor fabrication equipment unit and delivery of the second lot of unprocessed substrates to the semiconductor fabrication equipment unit by the JIT module based on the processing data and the priority of one or both of the first lot of processed substrates and the second lot of unprocessed substrates.

In another exemplary embodiment, a semiconductor fabrication system includes a semiconductor fabrication equipment unit configured to perform a semiconductor fabrication process on a first lot of unprocessed substrates to form a first lot of processed substrates, wherein the semiconductor fabrication equipment unit is further configured to produce processing data regarding the first lot of processed substrates and a local storage device configured to hold both processed and unprocessed substrate lots and to transport both processed and unprocessed substrate lots to and from the semiconductor fabrication equipment unit. The semiconductor fabrication system further includes a just-in-time (JIT) module in communication with the semiconductor fabrication equipment unit and the local storage device and configured to schedule removal of the first lot of processed substrates from the equipment unit and delivery of a second lot of unprocessed substrates to the equipment unit based on the processing data and a universal transportation system configured to transport both processed and unprocessed substrate lots to and from the equipment unit.

In yet another exemplary embodiment, a method for fabricating semiconductors utilizing a semiconductor fabrication system includes performing a semiconductor fabrication process on a first lot of unprocessed semiconductor substrates with a semiconductor fabrication equipment unit to form a first lot of processed substrates, communicating processing data regarding the first lot of processed substrates from the semiconductor fabrication equipment unit to a just-in-time module of the semiconductor fabrication system, and determining a processing priority of the first lot of processed substrates and a processing priority of a second lot of unprocessed substrates at JIT module. The method further includes scheduling removal of the first lot of processed substrates from the semiconductor fabrication equipment unit and delivery of the second lot of unprocessed substrates to the semiconductor fabrication equipment unit by the JIT module based on the processing data and the priority of one or both of the first lot of processed substrates and the second lot of unprocessed substrates and subsequent to scheduling delivery of the second lot of unprocessed substrates, rescheduling a different delivery time for the second lot of unprocessed substrates based on addition data processed in a global optimization module.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

Exemplary embodiments of the present disclosure will hereinafter be described in conjunction with the following drawing figures, wherein like numerals denote like elements, and wherein.

DETAILED DESCRIPTION

Figure 1:
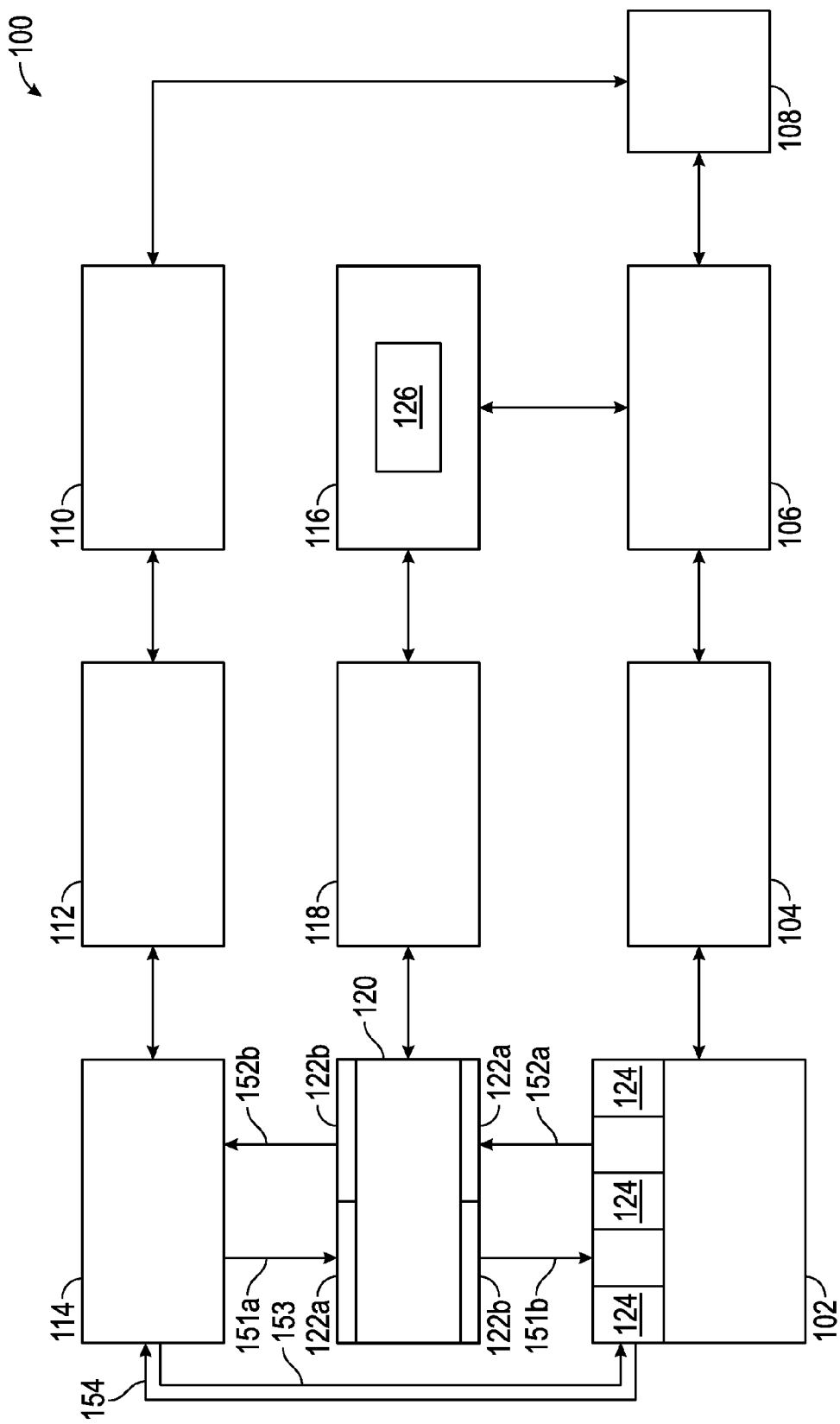
FIG. 1 is a schematic view of an integrated circuit fabrication system in accordance with an exemplary embodiment.
Figure 2:
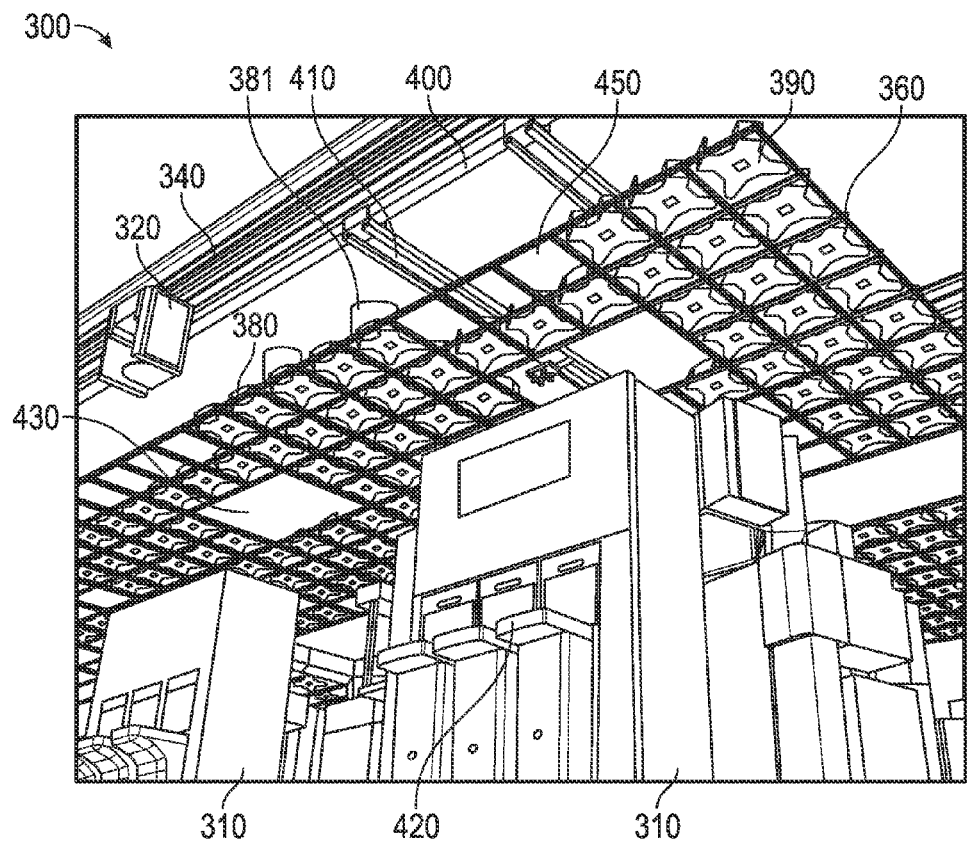
FIGS. 2-4 are isometric views of a matrix material handling system in accordance with an exemplary embodiment.

The following detailed description is merely exemplary in nature and is not intended to limit the semiconductor fabrication methods and systems contemplated herein. Furthermore, there is no intention to be bound by any theory presented in the preceding background or the following detailed description.

Growing technological requirements and the worldwide acceptance of sophisticated electronic devices have created an unprecedented demand for large-scale, complex, integrated circuits. Competition in the semiconductor industry requires that products be designed, manufactured, and marketed in the most efficient manner possible. This requires improvements in fabrication technology to keep pace with the rapid improvements in the electronics industry. These improvements, in turn, require effective utilization of computing resources and other highly sophisticated equipment to aid, not only in the design and fabrication, but also in the scheduling, control, and automation of the manufacturing process.

With reference now to the fabrication of integrated circuits, it is appreciated in the art that modern integrated circuit designs include numerous structures or features, typically the size of a few micrometers or less. These features are placed in localized areas of a semiconducting substrate, and are either conductive, non-conductive, or semi-conductive (i.e., rendered conductive in defined areas with dopants). The fabrication process generally involves processing a number of substrates through a series of fabrication tools. Each fabrication tool performs one or more of four basic operations discussed more fully below. The four basic operations are performed in accordance with an overall process to finally produce the finished integrated circuits.

During the fabrication of integrated circuits, layers of materials are added, removed, and/or treated during fabrication to create the integrated circuits that make up the device. The fabrication processes include the following four basic operations:

layering, or adding thin layers of various materials to a substrate from which an integrated circuit is produced;

patterning, or removing selected portions of added layers;

doping, or placing specific amounts of dopants in selected portions of the substrate through openings in the added layers; and heat treating, or heating and cooling the materials to produce desired effects in the processed substrate.

Although there are only four basic operations, they can be combined in hundreds of different ways, depending upon the particular fabrication process.

To facilitate processing of substrates through a process flow, substrates are typically grouped into lots. Each lot is housed in a common substrate carrier. Carriers are transported to various process and metrology tools throughout the fabrication facility to allow the required processes to be completed to fabricate integrated circuit devices on the substrates. Further, as lot sizes are decreased for specialized processing applications, the term substrate "lots" as used herein is also intended to refer to reticles on reticle pods.

Modern substrate fabrication facilities employ automated material movement systems to satisfy ergonomic concerns and to maintain a high level of automation. Interbay/intrabay vehicle automated material handling systems (AMHS) may be employed to automate the transfer of substrates to the tools required in the process flow. One factor contributing to the efficiency of the automated material handling system is the delivery time between tools. Delivery time may vary depending on the distance between tools, the congestion of the tools, and the distance that an idle material handling vehicle needs to travel to pick up a waiting substrate carrier. Delivery times directly affect tool utilization and system throughput.

As detailed below, the semiconductor fabrication methods and systems disclosed herein utilize a novel combination of both "just-in-time" lot dispatching and WIP reordering while in the queue for a fabrication tool. First, regarding the just-in-time lot dispatching, the present disclosure provides a universal, distributed and scalable heuristic method combined with data mining for just-in-time WIP dispatching and pickup enablement without loss in throughput. That is, in highly automated wafer factories, often the next free tool will immediately receive a lot assignment. This may lead to insufficient dispatch decisions, since other lots may appear during the wait time of the dispatched lot at the tool. The solution is just-in-time reservation addressing for the minimization of lot queue times at the tool and prevention of tool idle times. This method leads to longer cascades and to reduced cycle time for priority lots. In some embodiments, Next, regarding the WIP reordering while in the queue, the present disclosure provides embodiments that allow an external WIP optimization system to provide input to as to which WIP that is already in the queue for the tool goes next into the tool at the exact moment when the tool becomes available. This is a synchronized approach to scheduling and dispatching that may be implemented with buffered WIP processing solution, as will be described in greater detail below. WIP reordering has been discovered to result in the significant benefit of achieving relatively high on-time delivery of lots as compared to prior art system implementations.

In an embodiment, the "just-in-time" lot dispatching and WIP reordering may be implemented using an exemplary fabrication system 100 as illustrated in FIG. 1. As shown, the system 100 includes an equipment unit 102, which may be a process module or process tool for performing a fabrication process, a metrology process, a sorting process, or a handling process. "Equipment unit" is used herein to refer to any process equipment, such as process modules and process tools, whether for fabricating, measuring, sorting, or handling.

As further shown in FIG. 1, equipment unit 102 is in communication with an equipment interface (EI) or host controller ("host") 104. The host 104 is in communication with a manufacturing execution system (MES) 106. Further, the MES 106 transmits and receives data from a real-time dispatch (RTD) 108 (which also includes a scheduler). In some embodiments, the RTD 108 may also function as the above-noted external WIP optimization system for use in WIP reordering while in the queue. The MES 106 is also in communication with an automated material handling system equipment interface (AMHS-EI) 110. The AMHS-EI 110 communicates with an AMHS material control system (MCS) 112. Further, the MCS 112 communicates with a transport system 114, such as an overhead transport system. The system components 104, 106, 108, 110, 112, and 114 perform functions that are analogous to the functions of the corresponding components described above with regard to FIG. 1.

As further shown in FIG. 1, however, the system 100 also includes a local management unit (LMU) 116. The LMU 116 communicates directly with the host 104 to receive equipment data (which, as noted above is more extensive than the data available in centralized systems). Further, the LMU 116 is in communication with a local storage control (LSC) 118 (or buffer control unit). The LSC 118 communicates with a local storage device (LSD) 120, which may be a fixed buffer or internal buffer storage device.

LSD 120 includes a plurality of input ports 122a and a plurality of output ports 122b (together referred to as "buffer" ports) for receiving/delivering substrate carriers. Further, the input/output ports 122a/122b are arranged for interaction with equipment ports 124 on the equipment unit 102. The input ports 122a and output ports 122b provide access to/from the LSD 120, which acts as a "buffering" zone for substrate carriers as they await entry into the fabrication tool, or as they await further transport after delivery from the fabrication tool. The ports 122a, 122b are in direct communication with the equipment ports 124, which provide access into/out of the tool. In some embodiments, the LSD 120 is embodied as a "matrix material handling system" (MMHS), as will be described in greater detail below. Accordingly, system 100 provides a "buffered solution" to WIP processing, as initially noted above. Previously-known buffered solutions do not allow for WIP reordering while in the queue for a particular tool. However, as will be described in greater detail below, WIP reordering is made possible with the use of an external WIP optimization system (RTD 108 for instance) to provide input as to what WIP goes next at the exact moment when this method is ready to send the next WIP to the equipment. As noted above, WIP reordering has been discovered to result in the significant benefit of achieving relatively high on-time delivery of lots as compared to prior art system implementations.

Further in system 100, a scheduler 126 is positioned at the local management unit 116. The local management unit 116 receives processing data which may include a predicted process completion time, the identity of substrate lots at the equipment unit 102, the number of steps remaining in a process at the equipment unit 102, the status of equipment ports 124 (whether vacant or occupied) at the equipment unit 102, the status of input/output ports 122a/122b (vacant or occupied) at the local storage device 120, the identify of substrate lots at the local storage device 120, substrate temperature data, equipment temperature data, storage device temperature data, sensor information, process parameters, preventative maintenance data, carrier state information, substrate location and/or process data, and/or robot interlock information among other equipment and storage device information. In some embodiments, the scheduler 126 may be the RTD 108, for example with for example with a limit set of WIP.

The substrate carriers are exchanged between the equipment unit 102 and the transportation system 114 in several manners. In one exchange procedure, referred to herein as a "local" exchange procedure, for entry into the tool 102, as represented by transportation path 151a/151b, the substrate carriers are transported from the transportation system 114 to the LSD 120, i.e., into one of the plurality of input ports 122a thereof (151a), wherein they await subsequent delivery into the equipment ports 124 of tool 102 via output ports 122b (151b). In this exchange procedure, as represented by transportation paths 152a/152b, for withdrawal from the tool 102, the substrate carriers are first deposited into the LSD 120 via one of the plurality of input ports 122a (152a), wherein they await subsequent transport back to the transportation system 114 via one of the output ports 122b (152b). This procedure is suitable for use in low-priority or intermediate priority operations, where "buffering" of the substrates in the LSD 120 during transit from/to the transportation system 114 is desirable. As such, this exchange procedure allows for greater flexibility in the order of processing substrates. This procedure is "local" in the sense that a local layer of prioritization is enabled by the introduction of the LSD 120, which is controlled by LMU 116. The local exchange procedure is coordinated with the universal or system-wide transportation system by the communication between LMU 120 and transportation system 114, which is controlled by the RTD 108.

In another exchange procedure, referred to herein as a "universal" exchange procedure, for entry into the tool 102, as represented by transportation path 153, the substrate carriers are transported from the transportation system 114 directly into the equipment ports 124 of the tool 102. In this procedure, as represented by transportation path 154, for withdrawal from the tool 102, the substrate carriers are transported directly from the equipment ports 124 to the transportation system 114. This exchange procedure is suitable for use in high-priority operations, where buffering of the substrates in the LSD 120 would undesirably delay processing, and immediate entry into the tool 102 is desirable. As such, this exchange procedure allows for greater speed in the processing of substrates.

In an exemplary embodiment, as shown in FIG. 1, the system 100 includes all four transportation paths 151-154. As such, the system achieves a high degree of flexibility by allowing for both buffered processing (i.e., paths 151a/151b and 152a/152b) and priority-transport processing (i.e., paths 153 and 154). For example, as noted above, a fabrication environment may include both high-priority test substrates undergoing research and development, in addition to low priority bulk-processed substrates. The AMHS-EI 110 may be configured to communicate a command for priority processing, i.e., direct transport of the test substrates via paths 153 and 154 into and from the tool 102, whereas the LMU 116 may be configured to communicated a command for buffered processing, i.e., transport via the ports 122a, 122b of the bulk substrates via paths 151a/151b and 152a/152b.

As initially noted above, in one embodiment, the LSD 120 may be embodied as a "matrix material handling system" (MMHS), the configuration of which is described in greater detail as follows. Referring now to FIGS. 2-5, an exemplary MMHS 300 is disposed over a plurality of manufacturing tools 310, such as tools used in the fabrication of semiconductor devices. In a semiconductor fabrication environment, exemplary manufacturing tools 310 include processing tools (e.g., photolithography steppers, etch tools, deposition tools, polishing tools, rapid thermal processing tools, implantation tools, etc.), metrology tools, sorters, etc.

The particular tools 310 disposed below the MMHS 300, and their arrangement may vary depending on the particular implementation and the processing steps being performed. In one example, tools 310 in a common tool family may be grouped in common control areas. Hence, photolithography tools may be located in one control area, while etch tools may be located in another control area. In another example, the tools 310 may be grouped by process layer. Hence, the tools required to form a particular layer (i.e., starting with a photolithography step and terminating prior to the next photolithography step) may be grouped into a common control area.

The MMHS 300 includes one or more linear material handling vehicles 320 and one or more matrix material handling vehicles 330. Generally, the linear material handling vehicles 320 move along overhead rails 340 disposed in aisles 350 between the tools 310. An overhead rack 360 defines a plurality of storage positions 370 over the tools 310 for receiving wafer pods 380. The linear material handling vehicles 320 move wafer pods 380 between different areas of a manufacturing facility, to one of the tools 310, or to one of the storage positions 370 in the overhead rack 360. For example, predefined input/output (I/O) port positions 390 may be defined along the periphery of the overhead rack 360 to receive or dispatch pods 380 from or to the overhead rack 360. In one embodiment, an I/O port 390 may be provided on each side of the overhead rack 360.

The matrix material handling vehicles 330 move pods 380 to various positions within the overhead rack 360 or to one of the tools 310. The matrix material handling vehicles 330 are movably coupled to a gantry drive system including side rails 400 and a cross rail 410. The cross rail 410 includes a drive mechanism for moving along the side rails 400, and the matrix material handling vehicles 330 include a drive mechanism for moving along the cross rail 400 to access the various storage positions 370. The linear material handling vehicles 320 and the matrix material handling vehicles 330 also include hoist systems for raising or lowering the pods 380 to engage the overhead rack 360 or to interface with a load port 420 of one of the tools 310.

Drive systems for moving the vehicles 320, 330 along the rails 340, 400, 410 and hoist systems for raising and lowering the pods 380 to interface with the overhead rack 360 or the tools 310 are known to those of ordinary skill in the art, and as such are not described in greater detail herein.

Certain storage positions 385 may be equipped with equipment to establish a vacuum and/or to provide nitrogen purge gas (i.e., or some other inert gas) for pods 380 stored therein. These pods 380 may be stored under protected conditions (e.g., to avoid oxidizing exposed regions of the wafers) near the tools 310 needed for the next process operation. This protected storage near the tool 310 increases throughput and yield.

The overhead rack 360 defines one or more interior windows 430 to allow a matrix material handling vehicle 330 to interface with a load port 440 of a tool not disposed along the periphery of the overhead rack 360 (i.e., along an aisle 350). The matrix material handling vehicle 330 may be provided with rotating grippers to allow a wafer pod 380 to be rotated as well as lowered, so that the pod 380 may be aligned at any angle (e.g., aligned with various cluster tool facets). The overhead rack 360 also defines periphery windows 450 to allow access to the aisle-oriented load ports 420. Either the linear material handling vehicles 320 or the matrix material handling vehicles 330 can access the aisle-oriented load ports 420 to load the tools 310. Generally, a linear material handling vehicle 320 lowers the pod 380 and reaches out to engage the load port 420, while the matrix material handling vehicle 330 traverses through the periphery window 450 to engage the pod 380 with the load port 420.

Because the matrix material handling vehicle 330 can interface with a tool 310 through an interior window 430, the tools 310 need not be arranged in a completely linear fashion, as is the case in a conventional machine layout. Because the size and port orientation of the various tools 310 may vary, avoiding a linear layout allows a denser tool layout, thereby conserving floor plan space to increase fab capacity and reducing the traversal distance between tools 310 to increase throughput. Due to the number of storage positions 370 in the overhead rack 360 conventional stockers need not be provided in the MMHS 300, thereby reducing overall system cost and increasing throughput by avoiding moves to and from the stockers.

In one embodiment, the tools 310 disposed along the aisles 350 may be provided with conventional SEMI ports 440 for receiving conventional front opening unified pods (FOUP). These conventional ports 440 may be accessed by either the linear material handling vehicles 320 or the matrix material handling vehicles 330. Tools 310 disposed near the interior windows 430 may be provided with advanced ports for receiving advanced wafer pods. For example, pods 380 may be provided that do not open to external atmosphere for loading or unloading. A protective gas may be provided during the transfer operation. The advanced load port may be provided for a cluster tool 310, a movable load/lock, etc. The use of advanced pods allows direct process to process moves, which increased both yield and throughput. These direct moves also eliminates the need for FOUP handling steps, thereby reducing hardware requirements and improving cycle times. In accordance with the present disclosure, a particular benefit of this matrix material handling system is an improved throughput by reducing the FOUP exchange time.

Figure 3:
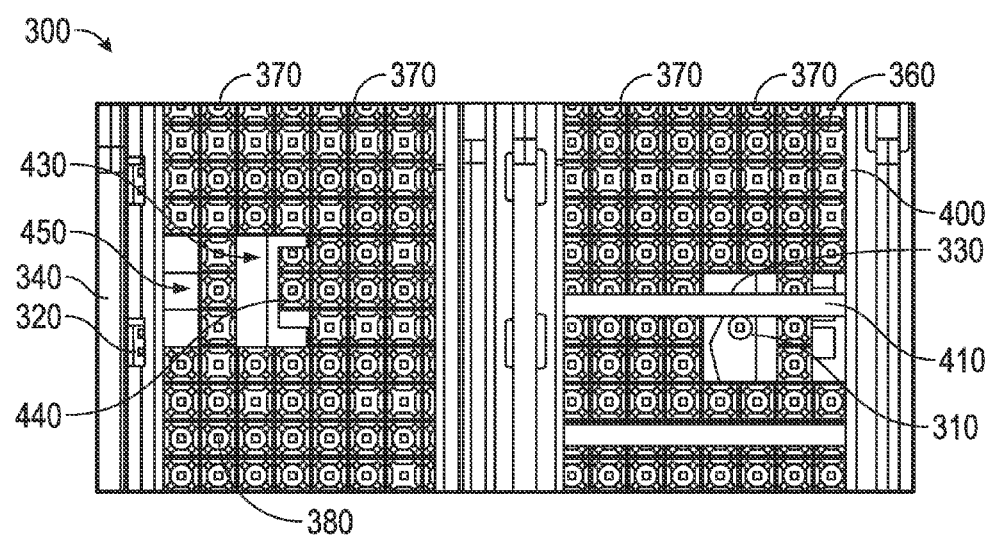
Figure 4:
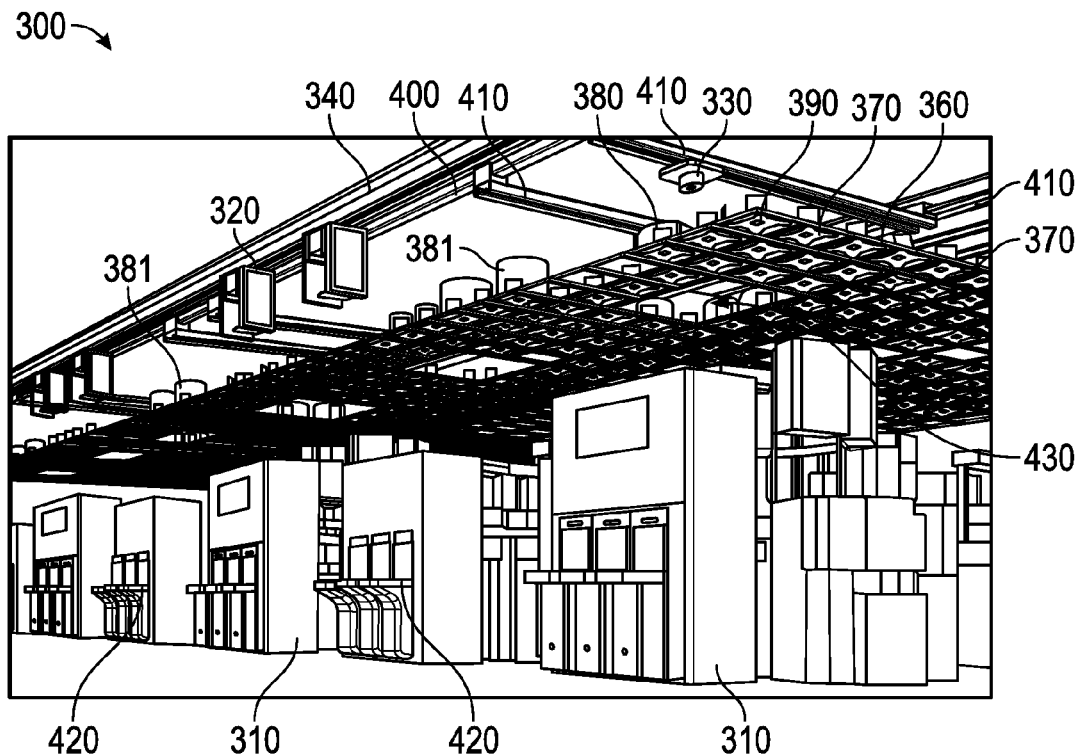
Figure 5:
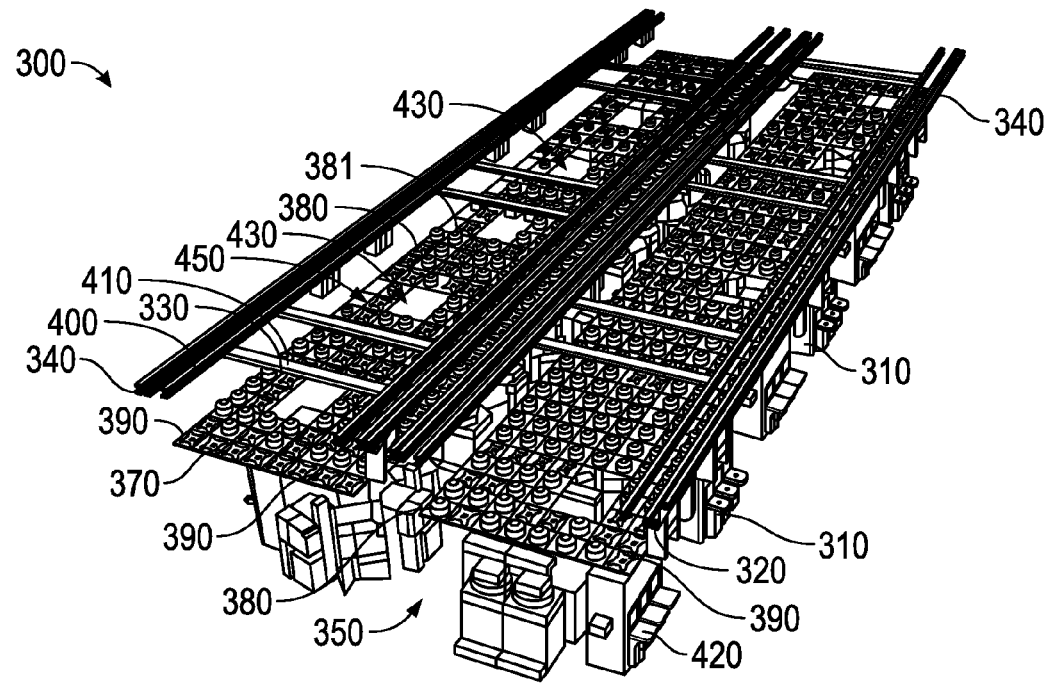
FIG. 5 is a top view of the matrix material handling system of FIGS. 2-4.

The overhead rack 360 may be shared by more than one matrix material handling vehicle 330. For example, as shown in FIG. 3, four or more cross rails 400 may be provided over the rack 360, each with its own matrix material handling vehicle 330. Shared regions may be defined in the overhead rack 360 that can be accessed by different matrix material handling vehicles 330. One matrix material handling vehicle 330 can place a pod 380 in a storage position 370 after processing by a tool 310, and another matrix material handling vehicle 330 can retrieve the pod 380 at a later time to move it to a different tool 310 for the next operation. If one matrix material handling vehicle 330 fails, another matrix material handling vehicle 330 can bump the cross rail 400 out of the way to access storage positions 370 in the overhead rack 360 that had been serviced by the failed matrix material handling vehicle 330.

The MMHS 300 eliminates single points of failures because the overhead rack 360 can be loaded from by the linear material handling vehicles 320 using overhead rails 340 on either side. In cases where there is no failure, this effectively doubles the throughout density. Overlapping portions of the overhead rack 360 may be accessed by different matrix material handling vehicle 330. The two-dimensional capabilities of the matrix material handling vehicles 330 also allow fast swapping at the tools 310 and access to tools 310 disposed beneath the overhead rack 360. Traffic blockages associated with conventional linear material handling systems may be avoided due to the increased number of movement axes.

The proximity of the overhead rack 360 to the tools 310 allows shared local buffering for tools 310 of the same type. Multiple pods 380 requiring the same operation may be stored proximate tools 310 of the same type without requiring the scheduling system to identify the particular tool 310 that will perform the next operation. The matrix material handling vehicles 330 may deliver the pod 380 to the selected tool 310 after the dispatch decision is made without incurring a material handling delay. Kits of test wafers may also be stored proximate to tools 310 where they may be employed (e.g., to qualify a tool after maintenance) to save cycle time and reduce material handling traffic.

As noted above, the novel just-in-time dispatching and WIP reordering methods may be implemented using the above-described fabrication system 100 with the MMHS 300. First, regarding the just-in-time methods, previously-known just-in-time dispatching is based on a static model per equipment type that predicts the next throughput-maximizing lot delivery timestamp. The modeled equipment behavior depends dynamically on the product mix, implemented as black-box tool-software logic, and needs to be updated/changed whenever there is a modification of the equipment. In addition to the failure of dynamically adjusting to product mix, the previously-known systems do not improve based on real-time data even for constant conditions. Instead, the data used for building the model is prior data that is static in nature. Lot pickup approaches are based on similar static models per equipment type that predicts the next throughput-maximizing or cycle-time-minimizing lot pickup timestamp. The novel just-in-time processing methods of the present disclosure aim to improve upon the above-described deficiencies of previously-known just-in-time processing by utilizing a distributed and scalable heuristic method combined with data mining for just-in-time WIP dispatching and pickup enablement without loss of throughput.

Next, regarding the WIP reordering methods, traditionally, WIP is pushed to the equipment as soon as possible. This creates a queue at the equipment wherein the WIP stays in this state until the equipment is ready to process it. This creates a problem when another preferred WIP becomes available in the meantime and cannot be pushed forward. A WIP can be positioned quite early near the equipment where it is to be processed. But this binds the WIP virtually to the equipment. If a decision is made to use it on another equipment, that WIP needs to be moved away from the close proximity of the equipment selected before. This sort of extra AMHS move is unwanted and can be improved. Previously-known buffered solutions disallow reordering and keep a lot of WIP in the buffer at the priority dictated a long time ago. The novel WIP reordering methods of the present disclosure aim to improve upon the above-described deficiencies of previously-known buffered processing solutions by allowing an external WIP optimization system to provide input as to what WIP should go next at the exact moment when the equipment is ready to receive the next WIP. In some embodiments, the dispatching system can limit its scope in this decision to only lots available in the buffer. WIP reordering has been discovered to result in the significant benefit of achieving relatively high on-time delivery of lots as compared to prior art system implementations.

Figure 6:
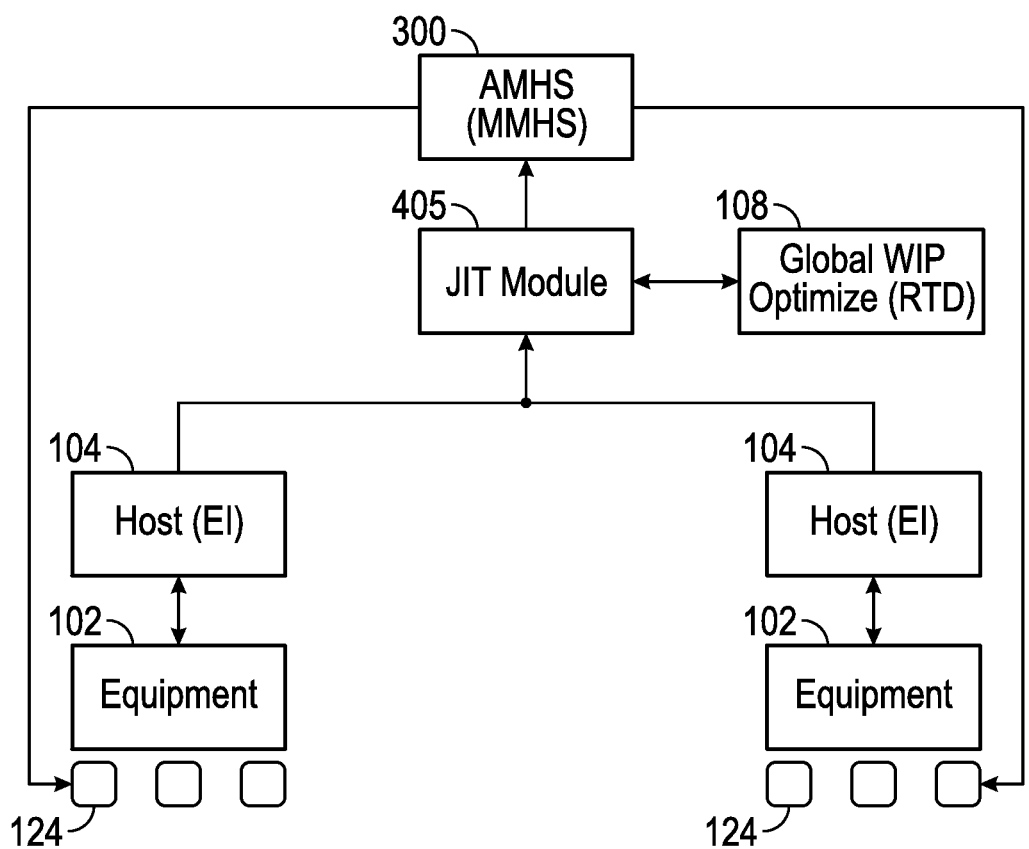
FIG. 6 is a schematic view of an integrated circuit fabrication system that incorporates just-in-time processing with WIP queue reordering in accordance with various exemplary embodiments of the present disclosure.

FIG. 6 is a schematic view of an integrated circuit fabrication system that incorporates just-in-time processing with WIP queue reordering in accordance with various exemplary embodiments of the present disclosure. As shown therein, and as initially set forth in FIG. 1, equipment unit 102 is in communication with an equipment interface (EI) or host controller ("host") 104. Each host controller 104 (for each respective equipment unit 102) communicates with the just-in-time (JIT) software module 405, as will be described in greater detail below. The JIT module 405 communicates with both the global WIP optimizer (which as mentioned above may be the RTD 108), as well as the AMHS (which as mentioned above may be embodied as MMHS 300). In this manner, it is important to note that, as shown in FIG. 6, the "local" portions of the system can connect directly with the "global" portions of the system. The MMHS in turn may communicate with the load ports 124 of the equipment 102 for delivering the WIPs thereto, as set forth above with regard to FIGS. 2-5.

In accordance with FIG. 6, the novel methods of the present disclosure employ JIP software module 405 that is in constant communication with data from equipment(s) 102 and the AMHS 300 for purposes of data mining to improve just-in-time dispatching and overcome the deficiencies of the prior art. Non-limiting, exemplary data that may be used for data mining, in an embodiment, is set-forth below:

Data From the Equipment 102
    time taken by each wafer to move from the carrier to the first station in the equipment;
    time taken by each wafer to move from the last station in the equipment back to the carrier;
    time taken by each wafer at each station (module);
    number of wafers currently in the equipment;
    distribution of wafer loading in the equipment (for equipment with multiple chambers where WIP can be loaded on separate chambers simultaneously);
    process time per wafer related to process steps;
    time taken by carrier to dock, undock, scan wafer map, upload/download recipes, and job creation;
    time taken by carrier to complete after last wafer has returned to carrier after processing;
    correlation between material running before/after/in conjunction with current WIP;

accuracy of learning fed back to the module for enhanced learning and account for constant C (this is calculated in time the equipment was either idle, or the carrier was idle, a +/− measure of the accuracy with which the carrier was delivered just in time);

historic tool states;

intermediate processing states of the reserved lots; and path (sequence of wafer positions on different modules of the equipment) traversed by the wafer with respect to the recipe (either by examining the wafer flow body, or correlating name of the recipe with the path of wafers in the Equipment)—this can translate to a state model whenever capable and wherever such state-change-combinations are manageable.

Data from the AMHS System 300 time taken by vehicle/robot to move from one location to another;

time taken by vehicle/robot to pick up a carrier; and time taken by vehicle/robot to deliver a carrier.

Some or all of the foregoing data may be used to automatically identify statistical patterns in real-time dynamic data from each equipment type without relying on detailed knowledge of the internal tool behavior. These patterns are processed to produce information that can be used in real-time to make decisions for just-in-time dispatching and pickup of WIP. Combined with data mining is the learning process wherein the system constantly matches/improves pattern recognition and adjusts the method that leads to precise dispatching and pickup just in time so that the decision to delay WIP dispatch can accommodate higher preference WIP (preferences on WIP change constantly).

Furthermore, some or all of the foregoing data may be used by the system to develop predictions for WIP pickup or drop-off. For example, in accordance with one embodiment, a data mining model may be used. This model looks at correlation between different data sets and creates a system to look at historic data and predict the outcome of the current situation by matching patterns between current data and correlating data from history. In accordance with another embodiment, a state machine model may be used. This model looks at the path of WIP through the equipment and builds a state machine model. It then utilizes the data in real-time to estimate the flow of future WIP to determine predictions of when to drop-off or pickup. In accordance with a further embodiment, a combination model may be used. This model is a combination of the data mining model and state machine model wherein the system examines the state of the machine in situations where the permutations and combinations of flow is less overwhelming, and looks at the data mining model in situations where the state machine model is incapable of providing accurate results. This is done in the learning system that receives feedback on the accuracy of the results. The system learns to adjust based on the situation so that static information is not required. In all the above models, the method decides when there is need to reorder WIP in queue before selecting one to deliver to the equipment. This decision is based on WIP in contention based on simultaneous availability or change in WIP queue from the last decision point. This decision could also be driven based on geographical placement of like equipment that can process similar kind of WIP.

The JIT module 405 uses the data in a real-time fashion to perform a number of tasks and actively predict the need for either delivering or picking up WIP in a timely manner. The software module performs classification, clustering, and associative learning from the accumulated data to gauge the availability of the AMHS system 300 and predict accurately the time at which point a vehicle is dispatched to either deliver a carrier to equipment or to send a vehicle to pick up a carrier from equipment. In addition, the method not only is capable of predicting the next pickup or drop-off, but to create an entire schedule of pickups and drop-offs based on a possibility of multiple requests potentially affecting the system at the same time. The method is capable enough to forecast when particular equipment would need WIP or when the equipment would be ready for WIP pickup based on the data available to it and using the various methods available built into it.

In view of the various illustrated embodiments, a fabrication facility may incorporate different embodiments that include a novel combination of both "just-in-time" lot dispatching and WIP reordering while in the queue for a fabrication tool. From the foregoing, it will be appreciated that the exemplary embodiments of the semiconductor fabrication method and system provide for reduced idle time of equipment units between completion of a process on a lot of substrates and commencement of processing a successive lot of substrates. Further, the semiconductor fabrication methods and systems allow for prioritization of lots. Beneficially, WIP reordering has been discovered to result in achieving relatively high on-time delivery of lots as compared to prior art system implementations.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating semiconductors utilizing a semiconductor fabrication system, the method comprising:

performing a semiconductor fabrication process on a first lot of unprocessed semiconductor substrates with a first semiconductor fabrication equipment unit to form a first lot of processed substrates;

communicating processing data regarding the first lot of processed substrates from the first semiconductor fabrication equipment unit to a just-in-time (JIT) module of the semiconductor fabrication system;

determining a processing priority of the first lot of processed substrates and a processing priority of a second lot of unprocessed substrates at the JIT module; and scheduling removal of the first lot of processed substrates from the semiconductor fabrication equipment unit, delivering the first lot of processed substrates to a second semiconductor fabrication equipment unit, and delivering the second lot of unprocessed substrates to the second semiconductor fabrication equipment unit, wherein the first lot of processed substrates and the second lot of unprocessed substrates are delivered to a local storage device of the second semiconductor fabrication equipment unit and are placed in a queue therein in a particular sequence by the JIT module based on the processing data and the priority of one or both of the first lot of processed substrates and the second lot of unprocessed substrates; and using a universal optimization system, reordering the sequence of either or both of the first lot of processed substrates and the second lot of unprocessed substrates in the queue such that the second semiconductor fabrication equipment unit will process the first and second lots in an order different than an original order previously dictated by the JIT module.

2. The method of claim 1 wherein the semiconductor fabrication equipment unit is selected from the group consisting of: a fabrication process tool, a metrology process tool, a sorting process tool, a substrate handling process tool, a fabrication process module, a metrology process module, a sorting process module, and a substrate handling process module.

3. The method of claim 1 wherein the processing data is communicated directly from the semiconductor fabrication equipment unit to a host controller, and directly from the host controller to the JIT module.

4. The method of claim 1 wherein the processing data includes data selected from the group consisting of: time taken by each wafer to move from the carrier to the first station in the equipment; time taken by each wafer to move from the last station in the equipment back to the carrier; time taken by each wafer at each station; number of wafers currently in the equipment; distribution of wafer loading in the equipment; process time per wafer related to process steps; time taken by carrier to dock, undock, scan wafer map, upload/download recipes, and job creation; time taken by carrier to complete after last wafer has returned to carrier after processing; correlation between material running before/after/in conjunction with current WIP; accuracy of learning fed back to the module; historic tool states; intermediate processing states of the reserved lots; and path traversed by the wafer with respect to the recipe.

5. The method of claim 1 wherein the local storage device is configured to deliver unprocessed substrates to, and remove processed substrates from, the second semiconductor fabrication equipment unit.

6. The method of claim 5 wherein the local storage device is a matrix material handling system.

7. The method of claim 6, further comprising communicating processing data regarding the first lot of processed substrates from the matrix material handling system to the JIT module of the semiconductor fabrication system, wherein the processing data is selected from the group consisting of: time taken by vehicle/robot to move from one location to another; time taken by vehicle/robot to pick up a carrier; and time taken by vehicle/robot to deliver a carrier.

8. The method of claim 7 wherein delivering the first lot and delivering the second lot are performed by a universal transportation system that is configured to deliver unprocessed substrates to, and remove processed substrates from, a plurality of semiconductor fabrication equipment units.

9. The method of claim 1 wherein the semiconductor fabrication equipment unit includes equipment ports for receiving substrates, wherein each equipment port has a vacant or occupied status, wherein the method further comprises communicating the status of each equipment port from the semiconductor fabrication equipment unit to local and universal schedulers, and wherein the local and universal schedulers schedule removal of processed substrates from the semiconductor fabrication equipment unit and delivery of unprocessed substrates to the semiconductor fabrication equipment unit based on the status of each equipment port.

10. The method of claim 1 wherein the substrate lots are delivered and removed in substrate carriers, and wherein the substrate carriers are configured to hold varying numbers of substrates.

* * * * *